(12) United States Patent
Yuan et al.

(10) Patent No.: US 6,617,221 B1
(45) Date of Patent: Sep. 9, 2003

(54) METHOD OF MAKING CAPACITORS

(75) Inventors: Hao-Chih Yuan, Taipei (TW);
Nan-Huan Kuan, Chang Hua (TW);
Yuan-Ko Hwang, Hualien Hsien (TW);
Shih-Shiung Chen, Chiayi (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/354,044

(22) Filed: Jan. 30, 2003

(51) Int. Cl.[7] .............................................. H01L 31/331
(52) U.S. Cl. ....................................... 438/396; 438/253
(58) Field of Search ................................ 438/253, 254, 438/387, 396, 397

(56) References Cited

U.S. PATENT DOCUMENTS 6,274,435 B1 * 8/2001 Chen .......................... 428/267

* cited by examiner

Primary Examiner—George Fourson
Assistant Examiner—Fernando Toledo

(57) ABSTRACT

A method for manufacturing capacitors is disclosed. The method is applicable to a capacitor whose upper electrode area is smaller than the lower electrode area. It is featured in that a material, such as a TiN hard mask, is inserted between the conventional electrode metal layer and photo resist layer. This enables one to perform the in-situ photo resist layer removal step after dry etching the upper electrode metal. Since the photo resist layer removal step uses oxygen plasma, the surface of the lower electrode polysilicon is formed with a protective oxide layer because the dielectric layer is etched during the process of dry etching the upper electrode metal. Using the disclosed method can solve the corrosion problem on the upper electrode metal and avoid the lower electrode polysilicon from being corroded by the wet etchant.

19 Claims, 7 Drawing Sheets

METHOD OF MAKING CAPACITORS

BACKGROUND OF THE INVENTION

1. Field of Invention

The invention relates to a method for manufacturing capacitors and, in particular, to a manufacturing method for a capacitor whose upper electrode area is smaller than the lower electrode area. A hard mask is inserted between the conventional upper electrode metal and the photo resist layer. This enables one to perform the in-situ photo resist layer removal step after dry etching the upper electrode metal.

2. Related Art

Among the existing very large-scale integrated (VLSI) circuits, the capacitor is one of the most commonly used passive elements. It is often integrated into active elements such as bipolar transistors or complementary metal oxide semiconductor (CMOS) transistors. These capacitors usually have the forms of polysilicon-insulator-polysilicon (PIP), metal-insulator-silicon (MIS), metal-insulator-metal (MIM), and metal-insulator-polysilicon (MIP).

With reference to FIGS. 1A through 1E, the MIP capacitor is featured in that its upper electrode area is smaller than the lower electrode area (the capacitance is defined by the upper electrode). This conventional manufacturing method includes the following steps. First, as shown in FIG. 1A, a substrate 10 such as a silicon wafer is provided. Then a lower electrode polysilicon 20 is formed to cover part of the substrate 10. Afterwards, a dielectric layer 30 is formed to cover the lower electrode polysilicon 20 and part of the substrate 10. An inter layer dielectric (ILD) 40 is formed to cover the dielectric layer 30, except for the part that covers the lower electrode polysilicon 20. An upper electrode metal 50 is formed to cover the ILD 40 and part of the dielectric layer 30 on the lower electrode polysilicon 20. The upper electrode metal 50 has an opening 60 above the lower electrode polysilicon 20.

As shown in FIG. 1B, a photo resist layer 70 is formed to cover the opening 60 of the upper electrode metal 50. Afterwards, the upper electrode metal 50 is dry etched with the photo resist layer as the mask, By appropriately controlling the etching time, the dielectric layer 30 can be protected from being etched. The upper electrode metal 52, the opening 100, and several metal blocks 80 are thus formed, as shown in FIG. 1C. The metal blocks 80 are formed at the bottom of the opening 100 as a result of imperfect dry etching.

The photo resist layer 70 is further used as the mask to perform wet etching to completely remove the metal blocks 80. As the wet etching is Isotropic, the upper electrode metal 52 is also etched, forming the arc side wall 90 shown in FIG. 1D. Afterwards, the photo resist layer 70 is removed to form the capacitor structure shown in FIG. 1E.

In the above-mentioned conventional capacitor manufacturing method, one has to properly control the etching time such that the dry etching does not penetrate through the dielectric layer 30 to damage the lower electrode polysilicon 20. However, this results in incomplete etching and leaves metal blocks 80. In fact, even if one extends the etching time to etch through the dielectric layer 30 and damage the lower electrode polysilicon 20, there will still be a few metal blocks 80 produced. In order to completely remove the metal blocks 80 after dry etching, the wet etching process is necessary. However, in order to protect the upper electrode metal 52 from seriously etched by the wet etchant, the step of removing the photo resist layer 70 is delayed until the wet etching is over. This further results in a problem. That is, if the Q-time between the end of the dry etching and the beginning of the wet etching is too long, the upper electrode metal 52 will be seriously corroded as it is exposed to the atmosphere.

SUMMARY OF THE INVENTION

In view of the foregoing, an objective of the invention is to provide a method for manufacturing capacitors to solve the problem of corrosion occurring to the upper electrode metal.

Another objective of the invention is to provide a method for manufacturing capacitors to prevent the lower electrode polysilicon from being corroded by the wet etchant.

According to the above objectives, the disclosed method is applicable to capacitors with an upper electrode smaller than the lower electrode in area. The method includes the following steps. First, a substrate is provided. A lower electrode polysilicon is formed to cover part of the substrate. A dielectric layer is formed to cover the lower electrode polysilicon and part of the substrate. An inter layer dielectric (ILD) is formed to cover the dielectric layer, except for the part that covers the lower electrode polysilicon. An upper electrode layer is formed to cover the ILD and part of the dielectric layer above the lower electrode polysilicon. The upper electrode layer has a first opening on top of the lower electrode polysilicon. Afterwards, a hard mask is formed to cover the upper electrode layer. A photo resist layer covers the hard mask in the first opening. The photo resist layer is used as the mask to dry etch part of the hard mask, part of the upper electrode metal, and part of the dielectric layer, forming a second opening and some metal blocks and exposing part of the lower electrode polysilicon. The metal blocks are formed at the bottom of the second opening. The photo resist layer is then removed to form an oxide layer on the exposed lower electrode polysilicon. The hard mask is used as the mask to perform wet etching for removing the metal blocks. Finally, the hard mask is removed.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

Figure 2A:
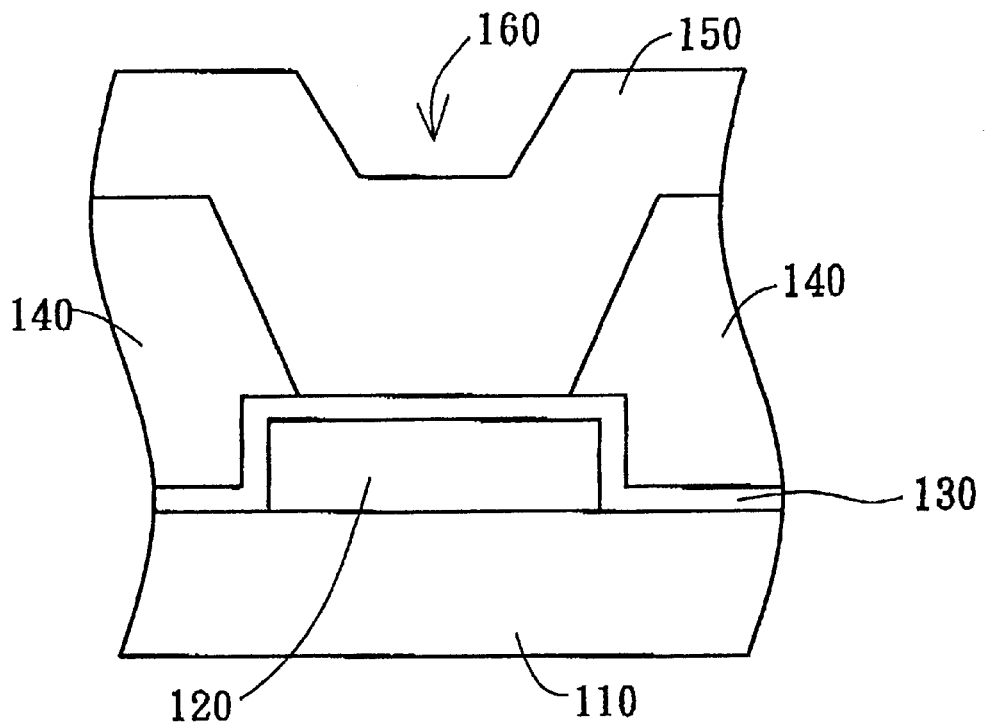
FIGS. 2A to 2G depict the cross-sectional structure of a preferred embodiment method of manufacturing capacitors according to the invention.

The disclosed method applies to the capacitors with an upper electrode smaller than its lower electrode in area. A hard mask is inserted between the conventional electrode metal layer and the photo resist layer. Using this method, the step of removing the photo resist layer can be performed in an in-situ way right after dry etching the upper electrode metal. Please refer to FIGS. 2A to 2G. Notice that the upper electrode has an area smaller than that of the lower electrode. A preferred embodiment of the invention includes the following steps. First, as shown in FIG. 2A, a substrate 110 such as a silicon wafer is prepared. Afterwards, a lower electrode polysilicon 120 with a lower electrode area is formed to cover part of the substrate 110. A dielectric layer 130 is formed to cover the lower electrode polysilicon 120 and part of the substrate 110. The material of the dielectric layer 130 can be silicon nitride and its thickness is about 300 Å. An inter layer dielectric (ILD) 140 is formed to cover the dielectric layer 130, except for the part that covers the lower electrode polysilicon 120. An upper electrode layer 150 is formed to cover the ILD 140 and part of the dielectric layer 130 above the lower electrode polysilicon 120. The upper electrode layer 150 has a first opening 160 on top of the lower electrode polysilicon 120. The material of the upper electrode metal 150 can be an aluminum-silicon-copper alloy and has an upper electrode area.

Figure 2B:
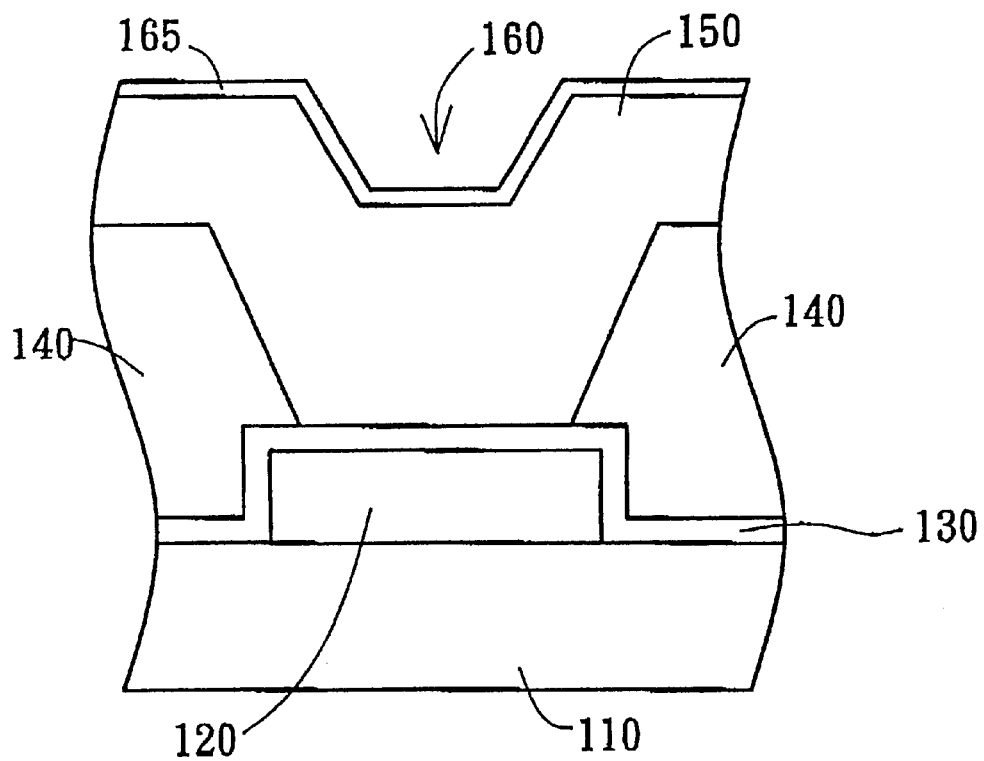

As shown in FIG. 2B, a hard mask 165 is formed to cover the upper electrode metal 150. The material of the hard mask can be TiN. The hard mask is used to protect the upper electrode metal 150 from being corroded from the top in the subsequent wet etching process.

Figure 2C:
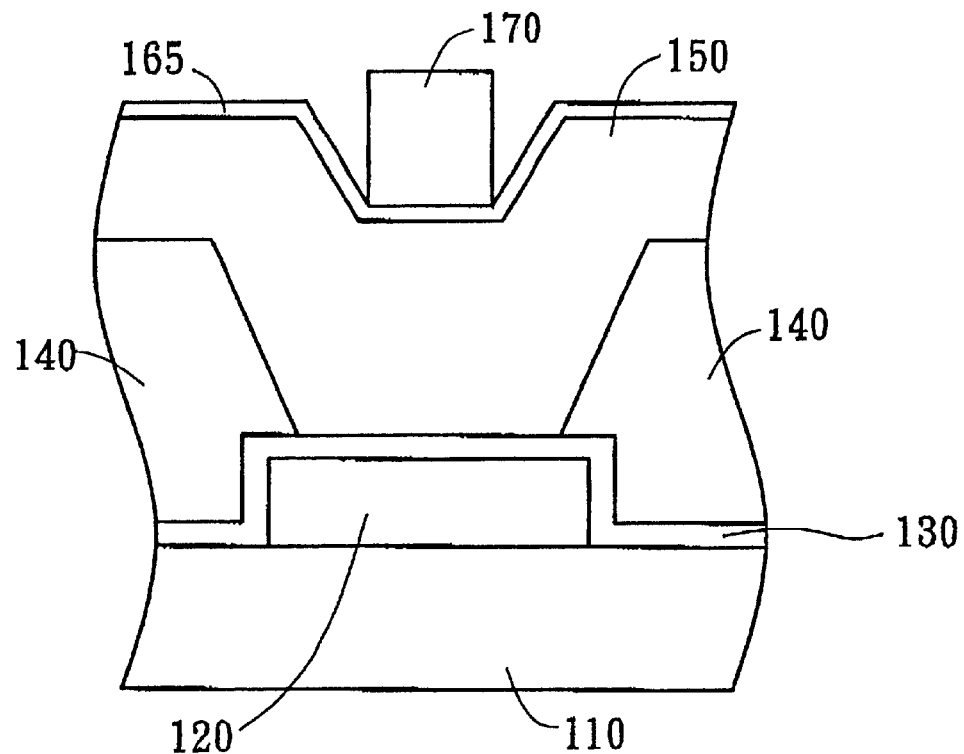
Figure 2D:
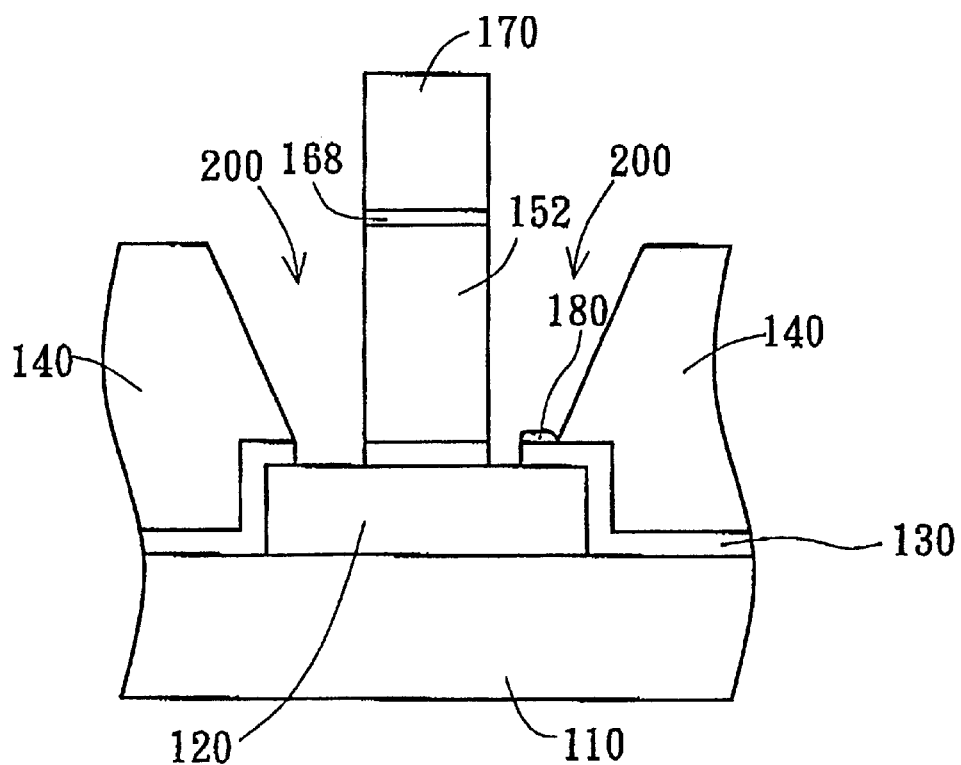
Figure 2E:
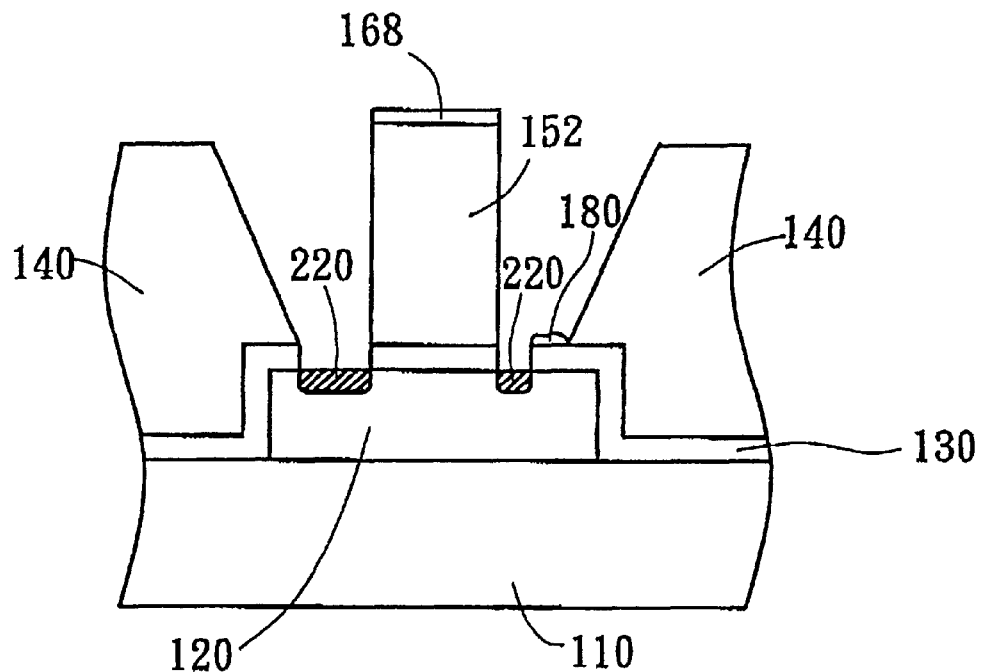

As shown in FIG. 2C, a photo resist layer 170 covers the hard mask 165 in the first opening 160. The photo resist layer 170 is used as the mask to dry etch part of the hard mask 165, part of the upper electrode metal 150, and the dielectric layer 130, forming the hard mask 168, the upper electrode metal 152, a second opening 200 and several metal blocks 180 as in FIG. 2D. Part of the lower electrode polysilicon 120 is exposed to the atmosphere through the opening 200, The metal blocks 180 are formed at the bottom of the second opening 200 as a result of incomplete dry etching.

The photo resist layer 170 is removed in an in-situ way in the same reaction chamber. Since this step requires oxygen, the exposed surface of the lower electrode polysilicon 120 is formed with an oxide layer 220 shown in FIG. 2E. The oxide layer 220 protects the lower electrode polysilicon 120 from being corroded in the subsequent wet etching process.

Figure 2F:
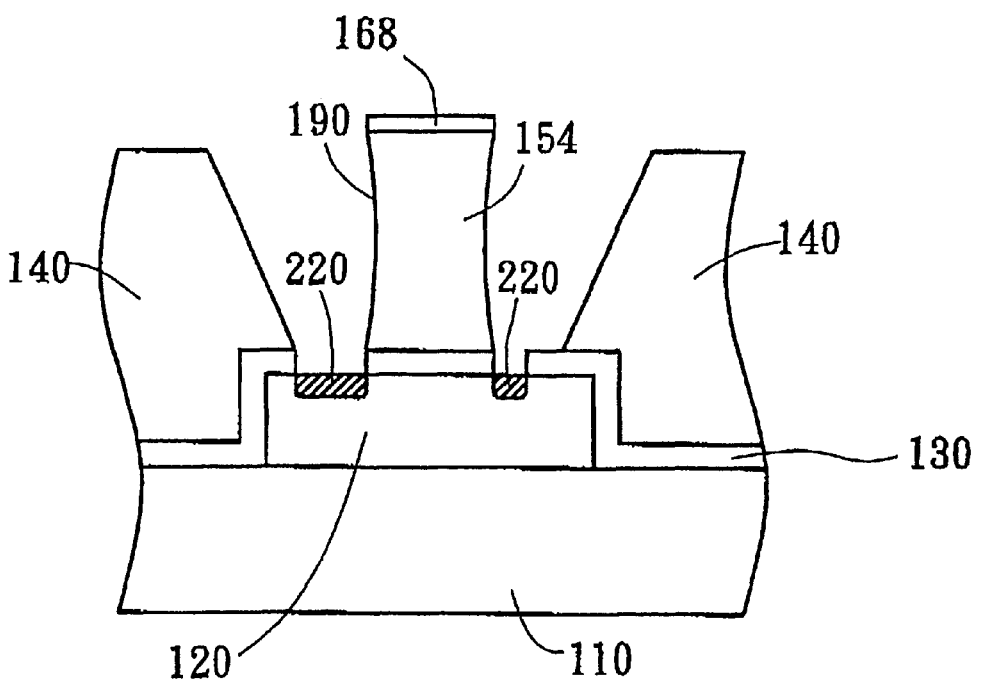
Figure 2G:
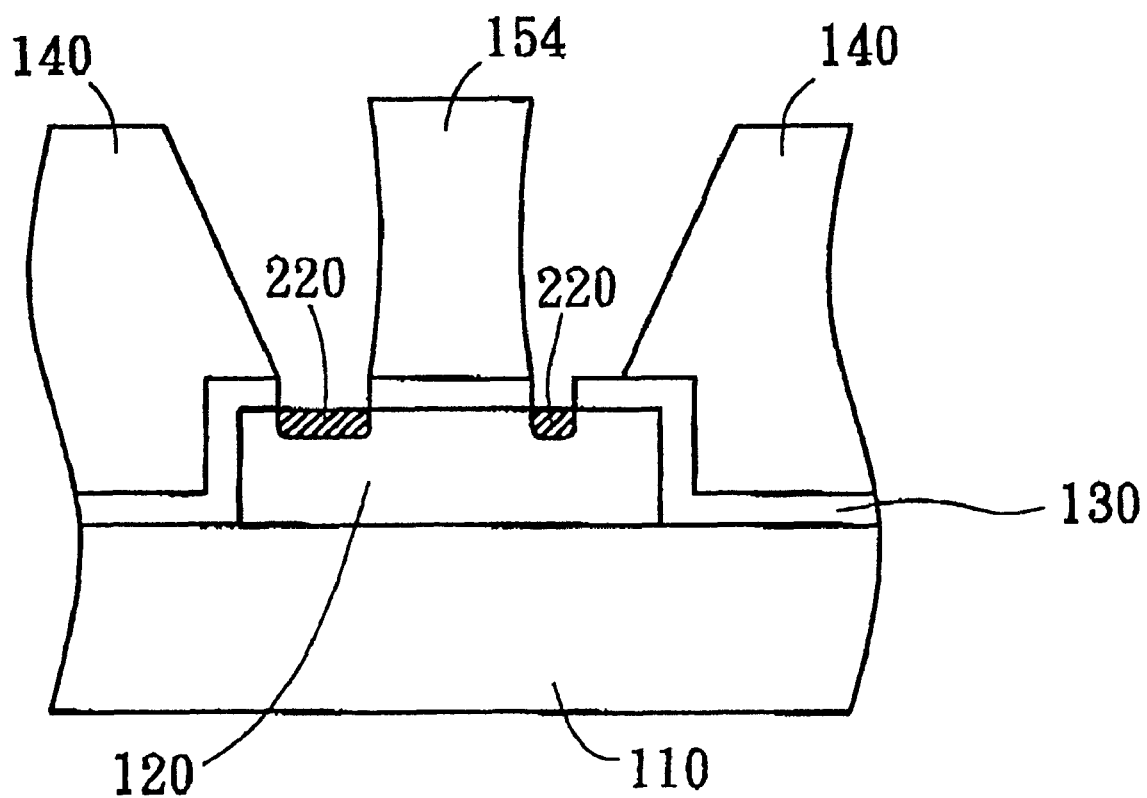

The hard mask 168 is used as a mask to perform wet etching, completely removing the metal blocks 180. Since wet etching is isotropic, the upper electrode metal 152 is also etched to form arc side walls 190 as shown in FIG. 2F. The structure shown in FIG. 2F is the capacitor formed using the disclosed method.

Figure 1A:
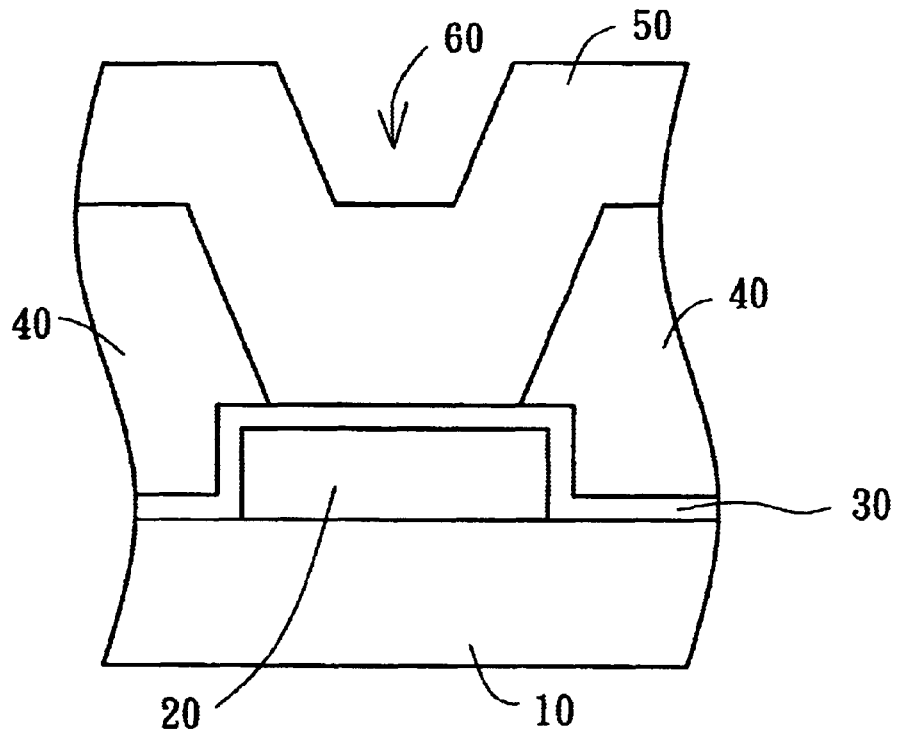
FIGS. 1A to 1E are cross-sectional views of the conventional capacitor manufacturing method.
Figure 1B:
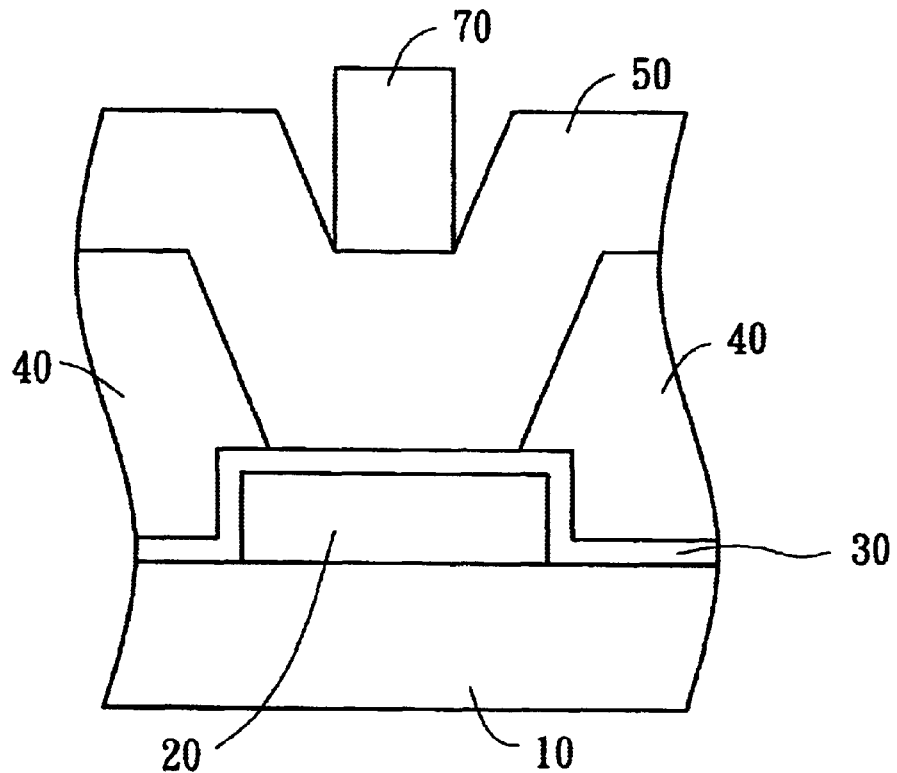
Figure 1C:
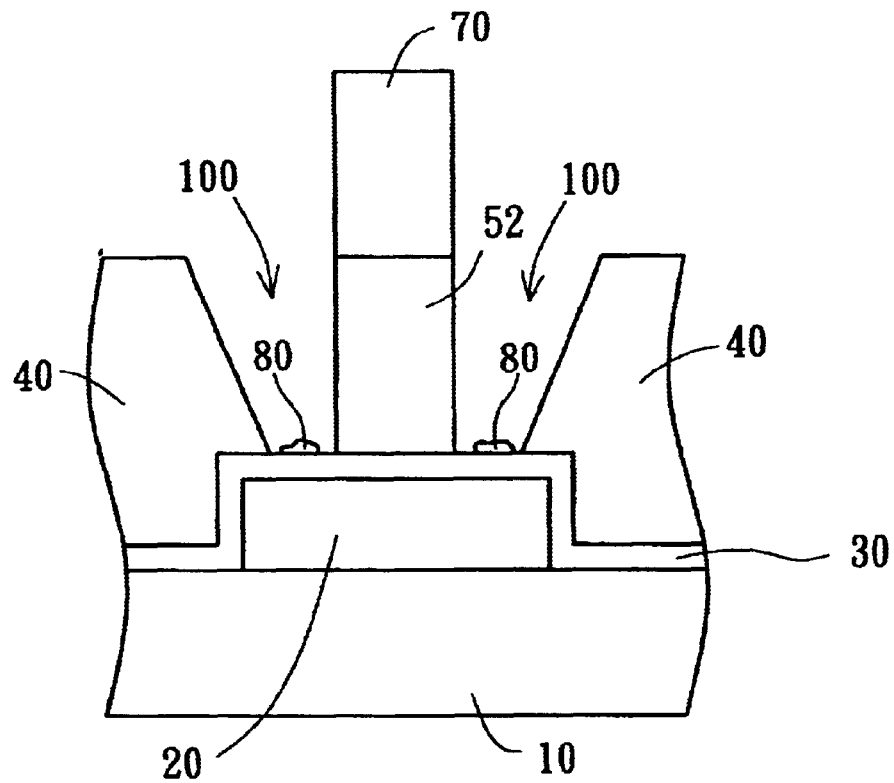
Figure 1D:
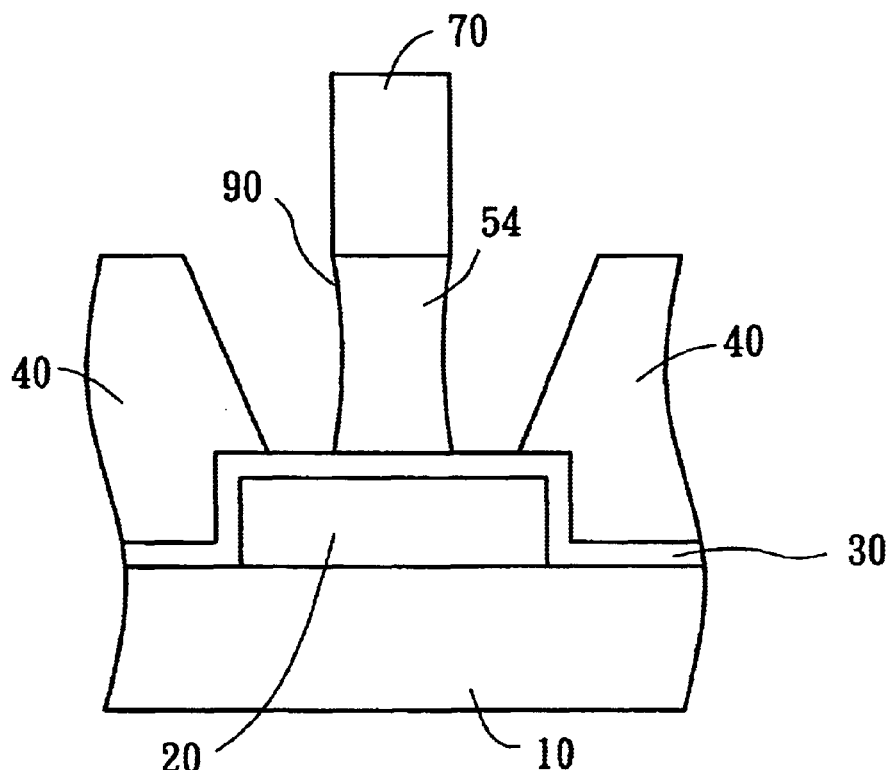
Figure 1E:
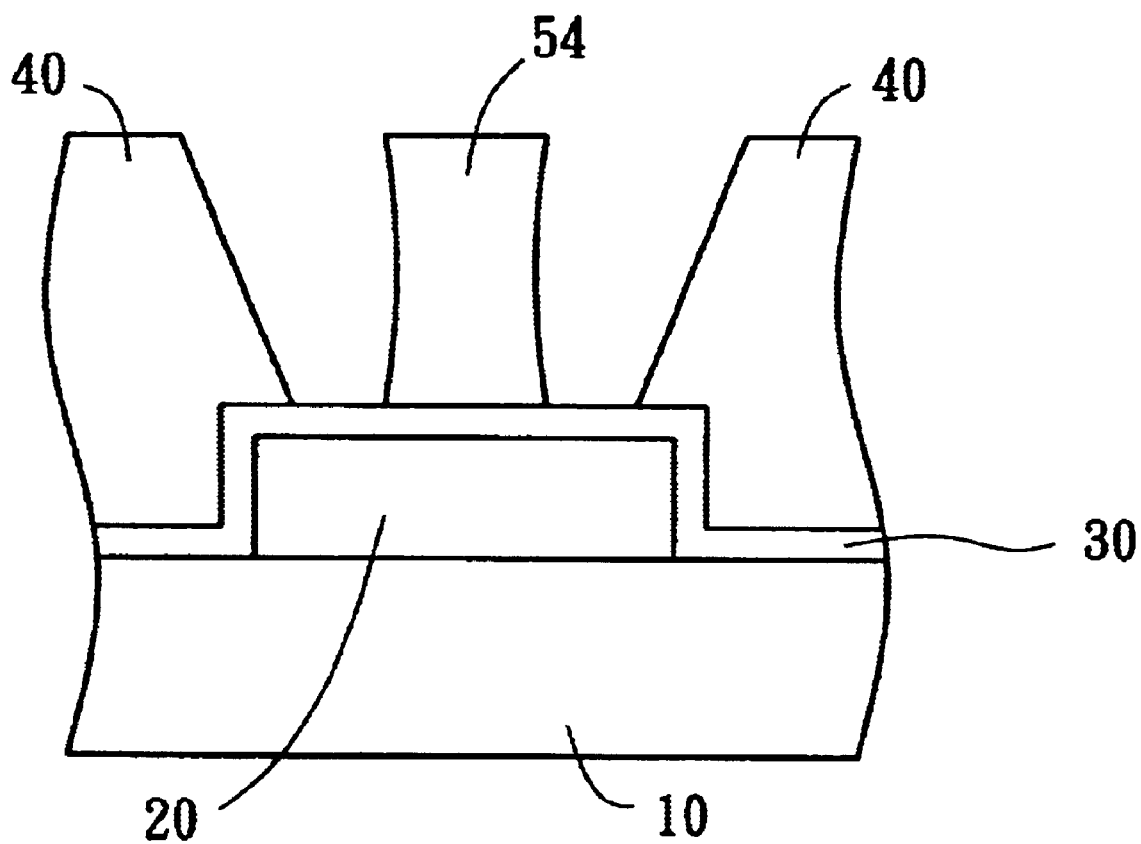

The capacitor structure shown in FIG. 2F and the conventional capacitor structure shown in FIG. 1E do not only differ in that FIG. 2F contains an oxide layer 220, but most important of all, FIG. 2F has the hard mask 168. The hard mask 168 does not affect the function of the capacitor and can be removed according to needs (see FIG. 2G). The step of removing the hard mask 168 can be achieved using the self side wall aluminum-fluorine protection (SSWAF) or the ammonium peroxide mixture (APM) impregnation method.

The above preferred embodiment is featured in that a hard mask made of, for example, TiN is inserted between the conventional upper electrode metal and photo resist layer to protect the upper electrode metal from being corroded from the top by wet etchant in the subsequent wet etching process.

In summary, one advantage of the invention is a method for manufacturing capacitors is proposed to solve the corrosion problem occurring to the upper electrode metal.

Another advantage of the disclosed method is that it prevents the lower electrode polysilicon from being etched by the wet etchant.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art Therefore, the scope of the appended claims should be accorded the broadest interpretation so as to encompass all such modifications and similar arrangements.

What is claimed is:

1. A method for manufacturing capacitors with an upper electrode smaller than its lower electrode in area, the method comprising the steps of:

providing a substrate;

forming a lower electrode polysilicon to cover part of the substrate, the lower electrode polysilicon spanning the lower electrode area;

forming a dielectric layer to cover the lower electrode polysilicon and part of the substrate;

forming an inter layer dielectric (ILD) to cover the dielectric layer, except for the part that covers the lower electrode polysilicon;

forming an upper electrode metal to cover the ILD and part of the dielectric layer that covers the lower electrode polysilicon, the upper electrode metal having an opening above the lower electrode polysilicon and spanning the upper electrode area;

forming a hard mask to cover the upper electrode metal;

forming a photo resist layer to cover the hard mask in the first opening;

using the photo resist layer as a mask to dry etch part of the hard mask, part of the upper electrode metal, and part of the dielectric layer, forming a second opening and a plurality of metal blocks, and exposing part of the lower electrode polysilicon, the metal blocks being formed at the bottom of the second opening;

removing the photo resist layer and forming an oxide layer on the exposed part of the lower electrode polysilicon;

using the hard mask as a mask and performing wet etching to remove the metal blocks; and removing the hard mask.

2. The method of claim 1, wherein the material of the dielectric layer is SiN.

3. The method of claim 1, wherein the thickness of the dielectric layer is 300 Å.

4. The method of claim 1, wherein the material of the upper electrode metal is an Al—Si—Cu alloy.

5. The method of claim 1, wherein the material of the hard mask is TiN.

6. The method of claim 1, wherein the step of removing the photo resist layer is performed in an in-situ way after the dry etching step.

7. The method of claim 1, wherein oxygen is used in the step of removing the photo resist layer.

8. The method of claim 1, wherein the step of removing the hard mask utilizes the self side wall aluminum-fluorine protection (SSWAF) method.

9. The method of claim 1, wherein the step of removing the hard mask utilizes the ammonium peroxide mixture (APM) impregnation method.

10. A method for manufacturing capacitors with an upper electrode smaller than its lower electrode in area, the method comprising the steps of:

providing a substrate, which has a lower electrode polysilicon covering part of the substrate, a dielectric layer covering the lower electrode polysilicon and part of the substrate, an inter layer dielectric (ILD) covering the dielectric layer except for the part that rovers the lower electrode polysilicon, and an upper electrode metal covering the ILD and part of the dielectric layer that covers the lower electrode polysilicon, the upper electrode metal having an opening above the lower electrode polysilicon and spanning the upper electrode area;

forming a hard mask to cover the upper electrode metal;

forming a photo resist layer to cover the hard mask in the first opening;

using the photo resist layer as a mask to dry etch part of the hard mask, part of the upper electrode metal, and part of the dielectric layer, forming a second opening and a plurality of metal blocks, and exposing part of the lower electrode polysilicon, the metal blocks being formed at the bottom of the second opening;

removing the photo resist layer and forming an oxide layer on the exposed part of the lower electrode polysilicon; and using the hard mask as a mask and performing wet etching to remove the metal blocks.

11. The method of claim 10, wherein the material of the dielectric layer is SiN.

12. The method of claim 10, wherein the thickness of the dielectric layer is 300 Å.

13. The method of claim 10, wherein the material of the upper electrode metal is an Al—Si—Cu alloy.

14. The method of claim 10, wherein the material of the hard mask is TiN.

15. The method of claim 10, wherein the step of removing the photo resist layer is performed in an in-situ way after the dry etching step.

16. The method of claim 10, wherein oxygen is used in the step of removing the photo resist layer.

17. The method of claim 10 further comprising the step of removing the hard mask.

18. The method of claim 17, wherein the step of removing the hard mask utilizes the self side wall aluminum-fluorine protection (SSWAF) method.

19. The method of claim 17, wherein the step of removing the hard mask utilizes the ammonium peroxide mixture (APM) impregnation method.

* * * * *

UNITED STATES PATENT AND TRADEMARK OFFICE
CERTIFICATE OF CORRECTION

PATENT NO.   : 6,617,221 B1
DATED        : September 9, 2003
INVENTOR(S)  : Yuan et al.

It is certified that error appears in the above-identified patent and that said Letters Patent is hereby corrected as shown below:

<u>Title page,</u>
Item [75], add -- Horn-Jer Wei -- as the first named inventor.

Signed and Sealed this

Second Day of March, 2004

JON W. DUDAS
*Acting Director of the United States Patent and Trademark Office*